(12) United States Patent
Suto et al.

(10) Patent No.: US 6,949,495 B2
(45) Date of Patent: Sep. 27, 2005

(54) CLEANING SOLUTION FOR REMOVING RESIDUE

(75) Inventors: Mizuki Suto, Yamaguchi-ken (JP);
Ichiro Mikami, Yamaguchi-ken (JP);
Tohru Nonaka, Yamaguchi-ken (JP);
Seiji Tono, Yamaguchi-ken (JP)

(73) Assignee: Tokuyama Corporation, Yamaguchi (JP)

( * ) Notice: Subject to any disclaimer, the term of this patent is extended or adjusted under 35 U.S.C. 154(b) by 248 days.

(21) Appl. No.: 10/111,457

(22) PCT Filed: Aug. 31, 2001

(86) PCT No.: PCT/JP01/07543
§ 371 (c)(1),
(2), (4) Date: Apr. 25, 2002

(87) PCT Pub. No.: WO02/19406
PCT Pub. Date: Mar. 7, 2002

(65) Prior Publication Data
US 2003/0004075 A1 Jan. 2, 2003

(51) Int. Cl.$^7$ ................................ C11D 17/00
(52) U.S. Cl. ................ 510/175; 510/176; 510/245; 510/405; 510/506; 134/38; 134/40
(58) Field of Search ................ 510/176, 175, 510/177, 178, 212, 499, 417, 506; 134/38, 40, 3

(56) References Cited

U.S. PATENT DOCUMENTS

| | | | | |
|---|---|---|---|---|
| 4,252,656 A | * | 2/1981 | Liebowitz et al. | 510/519 |
| 5,188,675 A | * | 2/1993 | Dormon-Brailsford | 134/4 |
| 5,691,288 A | * | 11/1997 | Dhillon | 510/171 |
| 6,211,130 B1 | * | 4/2001 | Josa Pons et al. | 510/314 |

* cited by examiner

*Primary Examiner*—Yogendra N. Gupta
*Assistant Examiner*—Mertie F. Taylor
(74) *Attorney, Agent, or Firm*—Sherman & Shalloway

(57) ABSTRACT

A solution for washing away residue, comprising an aqueous solution of a water-soluble high molecular compound in which is dissolved at least one kind of dissolving agent selected from an amine and a fluoride. The washing solution is capable of effectively washing away the residue formed during the production of electronic circuits, is very lowly corrosive to the insulating films, low-dielectric interlayer insulating films and wirings, and offers an advantage of little generating foam.

4 Claims, No Drawings

CLEANING SOLUTION FOR REMOVING RESIDUE

TECHNICAL FIELD

The present invention relates to a solution for washing away residue that is formed when the substrates are subjected to the ashing, etching or CMP processing in the production of electronic circuit patterns.

BACKGROUND ART

ICs, LSIs and LCDs on a semiconductor wafer are usually produced by forming fine electronic circuit patterns on a substrate relying upon the photolithography technology. Concretely speaking, a photoresist is applied onto a substrate wafer on which is formed an insulating film such as of silicon oxide, a wiring layer such as of Al, Cu, Si or Ti, or a low-dielectric interlayer insulating film such as of SOG or a fluorine-contained resin, followed by exposure to light through a mask forming desired patterns and by developing to form a resist pattern at desired portions. Then, the insulating film and the wiring layer or the low-dielectric interlayer insulating film are etched from above the resist pattern, and the resist is removed. In forming the electronic circuit pattern as described above, the photoresist is removed by being washed with a solution for washing residue or by the ashing treatment. The latter ashing treatment is to remove the resist by turning the resist into an ash thereof using energy such as of a plasma. On the surfaces from where the photoresist is removed after the ashing treatment, there remain incompletely ashed products called photoresist ashing residue and side-wall deposit films formed near the side walls of the patterns during the etching without being removed to a sufficient degree. Here, the side-wall deposit films stand for sparingly soluble products formed on the side walls of the photoresist mask or on the side walls of the patterns during the etching step due to complex reactions among the etching gas, photoresist, underlying insulating film, wiring layer, low-dielectric interlayer insulating film and substrate. The side-wall deposit films may often be intentionally formed in order to enhance the anisotropic etching effect, or may be formed against the will.

When the reactive ionic etching (RIE) is conducted, in particular, there are formed side-wall deposit films and incompletely ashed products of photoresist, which dissolve little, to a conspicuous degree. The RIE is a method of conducting the etching by applying a negative voltage to the wafer which is a substrate, and irradiating the reactive gas containing a halogen compound gas such as of carbon fluoride, hydrogen fluoride or hydrogen chloride with a plasma.

The photoresist is degenerated and becomes sparingly soluble even when it is subjected to the ion-injection treatment. Even after the ashing treatment, the incompletely ashed products of the photoresist form to a conspicuous degree. The ion-injection treatment is an operation for injecting ions such as of phosphorus, boron, antimony or arsenic into the resist surface from above the resist in order to form electrically conducting portions in the desired places. Here, the resist works as a mask enabling the ions to be selectively injected into the portions from where the resist is removed.

Inclusive of the photoresist after developing, the incompletely ashed products of photoresist remaining on the surfaces after the ashing treatment and the side-wall deposit films, cause defective contact to the wiring patterns and are, hence, desired to be removed by washing. Therefore, solutions of various organic solvents have been used for washing residues in an attempt to remove the residue inclusive of the photoresist. However, the photoresist to which ions are injected is degenerated. Besides, the photoresist residue after ashing is often a high degree of polymer or has partly been turned into inorganic, and cannot, hence, be removed to a sufficiently degree with the above residue-washing solutions.

Under such circumstances, Japanese Unexamined Patent Publication (Kokai) No. 67632/1999 discloses a residue-washing solution of a composition containing a fluorine compound, a water-soluble organic solvent and the remainder of water. Owing to a system of the fluorine compound and water, the above washing solution works to favorably peel off even the residues containing organic matters in relatively small amounts, and works to prevent the wiring material existing on the to-be-washed surfaces from being corroded since it contains the water-soluble organic solvent in an amount of from 50 to 80% by weight.

However, water is indispensable for the above washing solution to exhibit performance for removing the residue, and room for improvement still remains concerning the corrosion-preventing effect by using the organic solvent only. That is, the layer under the residue to be washed away has not been treated to be corrosion resistant to a sufficient degree. In particular, a problem of corrosion occurs in the metal wiring material such as of aluminum or aluminum alloy, or in the low-dielectric interlayer insulating film such as of SOG.

Concerning the above problem, the above publication proposes adding a surfactant in an attempt to prevent corrosion to a high degree.

However, foam generates by the addition of the surfactant. Adhesion of foam onto the wafer prevents the washing. Besides, when foam is brought out of the system, the surfactant component only decreases selectively in the residue-washing solution, and the effect for preventing the corrosion changes.

A problem still exists in that the residue which has further turned into inorganic due to severe ashing conditions, cannot be completely removed with the above washing solution. This is because, since the washing solution contains a large amount of the organic solvent as a corrosion-preventing agent, the fluorine compound added as a washing component is not allowed to exhibit its washing performance to a sufficient degree.

As a washing solution of a composition using an organic solvent which is a corrosion-preventing agent in limited amounts and using a surfactant as a corrosion-preventing agent, Japanese Unexamined Patent Publication (Kokai) No. 194144/2000 discloses a composition comprising a fluorine compound, an amphoteric surfactant and the remainder of water. This washing solution is capable of favorably removing the residues such as incompletely ashed products of photoresist which are transformed to a considerable degree and side-wall deposit films, causing the insulating film and the wiring layer on the substrate wafer to be corroded little.

Even with the above washing solution, however, a problem remains concerning the generation of foam at the time of washing the residue due to the addition of the amphoteric ionic surfactant.

It has therefore been desired to develop a residue-washing solution which is capable of exhibiting stable and excellent corrosion-preventing ability yet generating foam little even when the ratio of the organic solvent to the water is arbitrarily changed.

In recent years, on the other hand, there has been used a Cu wiring as a Cu damascene process. In this case, the pattern has been formed by grinding the Cu wiring by a method called chemical/mechanical polishing (CMP). After the CMP treatment, there remain, on the substrate, a polishing agent powder such as of alumina or silica as well as powders formed by grinding the substrate, such as of copper oxide, tantalum, tantalum nitride and residues such as of low-dielectric interlayer insulating film and insulating film. Here, most of the residues are inorganic matters which must be removed by strong washing. However, since the underlying wirings, too, are inorganic matters such as metals, corrosion of the underlayers cannot be avoided.

Concerning the problem of corrosion, there have heretofore been used aromatic hydroxy compounds, acetylene alcohols and triazole compounds as corrosion-preventing agents that are to be added to the washing solution. It can therefore be considered to use them as corrosion-preventing agents for the above washing solution. However, the washing solution that is obtained exhibits the corrosion-preventing property only weakly.

DISCLOSURE OF THE INVENTION

In view of the above-mentioned problems, therefore, the present inventors have conducted keen study. As a result, the inventors have discovered that the above problems can be solved by adding a water-soluble high molecular compound to an aqueous solution containing the solvent, and have completed the invention.

According to the present invention, there is provided a solution for washing residue residue that forms during the production of electronic circuits, the solution for washing away residue being an aqueous solution containing at least one kind of a dissolving agent selected from an amine and a fluoride, and further containing a water-soluble high molecular compound.

The dissolving agent used in the present invention is capable of very favorably dissolving the sparingly soluble residue owing to the synergistic action with water which is a solvent. The water-soluble high molecular compound is indispensable for obtaining a high corrosion-preventing ability though the mechanism of action has not yet been clearly known. The present inventors presume that the water-soluble high molecular compound is adsorbed by the surfaces of the oxide film and of the metals to form a protection film. Foam generates little since hydrophobic groups are not much possessed.

BEST MODE FOR CARRYING OUT THE INVENTION

In the present invention, it is essential to use at least one kind of a dissolving agent selected from an amine compound and a fluoride, and a water-soluble high molecular compound in combination.

Here, the dissolving agent is a substance capable of favorably removing the residue that is formed during the production of electronic circuits, i.e., capable of removing the residue relying upon a chemical reaction, an intermolecular force or an electrostatic affinity. The dissolving agent used in the present invention is selected from an amine compound and a fluoride. In the present invention, a fluoride is most favorably used from the standpoint of a high ability for removing residue.

A representative example of the fluoride may be an ammonium fluoride compound represented by the following general formula (1),

wherein four Rs may be the same or different, and are hydrogen atoms, alkyl groups or aryl groups.

As the alkyl group in the general formula (1), there can be preferably used lower alkyl groups having 1 to 3 carbon atoms, such as methyl group, ethyl group and propyl group. As the aryl group, there can be preferably used a phenyl group. Concrete examples of the ammonium fluoride compound represented by the above general formula (1) include ammonium fluoride (four Rs are all hydrogen atoms); fluorinated quaternary ammonium salts such as tetramethylammonium fluoride, tetraethylammonium fluoride, tetrapropylammonium fluoride, trimethyl-ethylammonium fluoride, triethyl-methylammonium fluoride, dimethyl-diethylammonium fluoride, dimethyl-dipropylammonium fluoride, tetraphenylammonium fluoride and trimethyl-phenylammonium fluoride; fluorinated tertiary ammonium salts such as trimethylammonium fluoride, triethylammonium fluoride and triphenylammonium fluoride; fluorinated secondary ammonium salts such as dimethylammonium fluoride, diethylammonium fluoride and diphenylammonium fluoride; and fluorinated primary ammonium salts such as monomethylammonium fluoride, monoethylammonium fluoride and monophenylammonium fluoride. In the present invention, these ammonium fluoride compounds may be used in one kind or in two or more kinds in combination. In the present invention, ammonium fluoride is most preferably used.

As the amine compound which is another dissolving agent, there can be used a methylamine, a benzylamine, a 1,3-propanediamine and a hydroxylamine.

These dissolving agents are usually dissolved in the washing solution. By taking the residue-washing ability and corrosion of the underlying wiring into consideration, it is desired that the concentration of the dissolving agent in the washing solution is in a range of from 0.05 to 1% by weight and, more preferably, from 0.1 to 0.5% by weight. When the amount of addition is smaller than 0.05% by weight, the residue is not often completely removed. When the amount of addition exceeds 1% by weight, the underlying wiring is often corroded.

The water-soluble high molecular compound used in the present invention stand for a synthetic or natural high molecular substance in which hydrophilic groups are statistically uniformly distributed in the molecules thereof. Concrete examples of the high molecules include polyvinyl pyrrolidone, polyethyleneimine, polyethylene glycol, polypropylene glycol, polyvinyl alcohol, polyethylene oxide, polyvinyl ether, polyacrylic acid, polyacrylamide, methyl cellulose, ethyl cellulose and hydroxyethyl cellulose. Those which are naturally existing include polyphosphoric acid, amylose, polysaccharide and gelatin. Among these water-soluble high molecular compounds, preferred examples include polyvinyl pyrrolidone, polyethyleneimine and polyacrylic acid.

The water-soluble high molecular compound has a molecular weight of not smaller than 3,000 and, preferably, not smaller than 10,000. When the molecular weight is not larger than 3,000, the effect for preventing the corrosion becomes weak. When the molecular weight is too great, on the other hand, the solubility in water decreases in general, or the viscosity of the solution increases causing the effect for preventing corrosion to become irregular. It is therefore desired that the molecular weight is not larger than 500,000 and, particularly, is in a range of from 10,000 to 100,000.

The water-soluble high molecular compound of the present invention contains hydrophilic groups in the molecules and is, hence, presumably adsorbed by the oxide film or the metal constituting the underlayer due to electric force or due to affinity such as coordination bond to form a protection film on the surfaces of the oxide film or the metal, exhibiting the effect of preventing corrosion. It is therefore desired that the water-soluble high molecular compound is used in an amount larger than necessary for forming a single molecular layer on the surfaces of the underlying metal. When used in too large amounts, however, the solution exhibits an increased viscosity, and the residue is not rather removed to a sufficient degree. It is therefore desired that the concentration of the water-soluble high molecular compound in the washing solution is in a range of from 0.05 to 1% by weight and, preferably, from 0.1 to 0.5% by weight.

The solvents constituting an aqueous solution of the present invention are usually ultrapure water and an organic solvent. Ultrapure water usually stands for the one used for the semiconductors and contains metal cations such as Na ions and K ions in a total amount of not larger than 5 ppb, and contains halogen ions in a total amount of not larger than 5 ppm. It is often desired to use an organic solvent in combination. The organic solvent used here is desirably soluble in water and is highly polar. Concrete examples include sulfoxides such as dimethyl sulfoxide; amides such as N,N-dimethylformamide, N-methylformamide, and N,N-dimethylacetamide; lactams such as N-methyl-2-pyrrolidone; ethers such as dioxane; alcohols such as isopropyl alcohol; and glycol ethers such as dipropylene glycol monomethyl ether, diethylene glycol monomethyl ether and diethylene glycol monoethyl ether.

In the present invention, there is no particular limitation on the ratio of mixing the above organic solvents. Usually, the ratio may be suitably selected depending upon the degree the residue to be washed away is turned into inorganic. For example, when the organic matter is not almost remaining in the residue due to severe ashing conditions such as lengthening the ashing time, there is preferably used a washing solution containing the organic solvent at a concentration of not larger than 40% by weight. When the residue contains organic matters in relatively large amounts because of the fact that the residue is the photoresist itself or the ashing treatment is weakly conducted, the organic solvent can be contained at a concentration in excess of 40% by weight, and the concentration of the organic solvent can be permitted up to 85% by weight and, preferably, up to 80% by weight. That is, when the concentration of the organic solvent in the washing solution is not smaller than 85% by weight, the washing ability tends to decrease irrespective of the kind of the residue.

For the residue containing organic matters in relatively large amounts, in particular, it is particularly desired to use glycol ethers or to use a water-soluble organic solvent containing glycol ethers from the standpoint of favorably removing the residue causing little corrosion.

When a glycol ether and any other water-soluble organic solvent are to be used in combination, a suitable organic solvent is at least the one selected from dimethyl sulfoxide, N,N-dimethylformamide and N-methyl-2-pyrrolidone. When used in combination, it is recommended that the amount of the glycol ethers is not smaller than 10% by weight and, preferably, not smaller than 20% by weight of the whole organic solvent.

The solution for washing away residue of the present invention can be prepared by simply mixing the components at predetermined ratios without any limitation on the temperature or on the stirring condition.

It is desired that the residue-washing solution used here has been refined to a sufficient degree to contain metal ions in an amount of not larger than 50 ppb, preferably, not larger than 10 ppm and, more preferably, not larger 1 ppb. If there are contained insoluble fine solid matters, it is desired that such matters are removed to a sufficient degree by the treatment such as filtering. For example, it is desired that the particles of not larger than 0.5 $\mu$m are contained in a number of not more than 50 in 1 ml and, particularly, that the particles of not larger than 0.3 $\mu$m are contained in a number of not larger than 50 in 1 ml.

As required, the above-mentioned residue-washing solution of the invention may further contain dissolution assistant such as surfactant, a reducing agent such as quinolinol and a defoaming agent, in addition to the above-mentioned water-soluble high molecular compound.

The photoresist to which the residue-washing solution of the invention is applied may be the known one without any limitation. The residue-washing solution is particularly preferably used for washing and removing the residue that stems from the photoresists for g-rays, i-rays, KrF excimer rays, ArF excimer rays, $F_2$ excimer rays, X-rays and electron rays used for the production of electronic circuit patterns. The residue-washing solution of the present invention exhibits particularly excellent washing effect when the resin forming the photoresist is a novolak resin, a polyhydroxystyrene resin or a polymethacrylic acid resin.

The residue-washing solution of the present invention is usually used for removing the photoresist and the residue after the developing is conducted on the semiconductor wafer or after the processing such as etching or ion injection, for removing the residue that generates after the wafer is put to the ashing treatment, or for removing the residue remaining after the CMP treatment in the production of electronic circuit patterns.

The ashing treatment for the photoresist can be conducted by a known method without limitation by ashing the photoresist by generating oxygen radicals. For example, there can be employed a batch method, a piece-by-piece method, an ozone ashing method or a UV ozone ashing method. The etching treatment may be either wet etching or dry etching. Usually, however, the residue after the dry etching is removed. As the dry etching, there can be employed plasma etching or reactive ion etching without limitation.

The slurry used for the CMP may be alumina, silica or the like. The method may be physically moving the wafer such as turning the wafer, rotating the pad to effect the polishing, or driving both of them.

Though there is no particular limitation, the substrate wafer is generally a silicon wafer or a glass having, formed on the surfaces thereof, an insulating film such as $SiO_2$ layer, a low-dielectric interlayer insulating film such as of SOG or fluorine-contained resin, or a wiring of Al, Cu, Si or an alloy thereof.

To wash the treated surface by using the residue-washing solution of the present invention, the treated surface may be immersed in the residue-washing solution, or the residue-washing solution may be sprayed onto the treated surface. In this case, there is no particular limitation on the temperature of the residue-washing solution. In general, the residue-removing ability increases when the washing solution is used being heated accompanied, however, by an increased probability of corroding the underlayers correspondingly. Therefore, the permissible washing time must be shortened. The temperature may be suitably set by taking the desired washing ability, prevention of corrosion and handling nature into consideration. Usually, the temperature is selected from a range of from 10 to 80° C. and, preferably, from 20 to 60° C.

The residue-washing solution after the use can be circulated by a pump to be repetitively used as long as possible. Or, the effective components only may be regenerated and reused.

EXAMPLES

Next, the invention will be described in further detail by way of Examples which, however, are in no way to limit the invention.

Examples 1 to 17 and
Comparative Examples 1 and 2

A thin TiN film was formed on an 8-inch silicon wafer and, then, an Al—Si—Cu film was formed thereon by using a sputtering device. An oxide film was further deposited thereon by using a plasma. Thereafter, a commercially available i-ray positive-type resist was applied thereon maintaining a thickness of about 1 micron and was pre-baked. Then, an i-ray was irradiated, followed by baking, developing, rinsing and post-baking. The sample was etched by RIE, and the used resist was ashed by using a plasma reactor. The ashing was conducted under the conditions of 0.04 mmHg of an oxygen gas at a temperature of 50° C. for 300 seconds.

Test pieces were cut out from the thus treated silicon wafer by using a diamond cutter. Washing solutions of compositions shown in Tables 1 and 2 were prepared, and the test pieces were immersed in the residue-washing solutions maintained at 23° C. Each of the residue-washing solutions was tested by using a total of 40 test pieces at an immersion time interval of one minute from the start of immersion until 40 minutes have passed. After the immersion times have passed, the test pieces were washed with ultrapure water, and the washed surfaces were observed by using a scanning electron microscope at a magnification of 40,000 times to find a time of when the side-wall deposit film and incompletely ashed product of the photoresist were removed. The shorter the time, the higher the washing performance.

The test pieces were further observed for their metal wire corrosion by using the scanning electron microscope at a magnification of 40,000 times. The testing times for the test pieces from which even a slightest corrosion was observed were roughly regarded to be corrosion-suppressing times, and were shown in Tables 1 to 3. The longer the corrosion-suppressing time, it can be said the more excellent the corrosion-preventing property.

By using the residue-washing solutions, the immersion times from when the residue was removed until when the corrosion of the metal wiring was recognized, were evaluated as permissible bands of the washing time at 23° C. The permissible band stands for the operation margin of the device. A large permissible band stands for a large allowance of dispersion in the time after the washing until the rinsing, or stands for a small yield.

The solutions were poured into glass bottles with caps, vigorously stirred, and were left to stand for one hour. The solutions which contained foam were denoted by X, and the solutions from which foam has favorably disappeared were denoted by ○ in Tables 1 to 3.

TABLE 1

| Example No. | Detergent | | | Performance | | | |
|---|---|---|---|---|---|---|---|
| | Name Numerals in ( ) represent molecular weights | | Amount added (wt %) | Removal of residue | Corrosion | Permissible washing time | Foaming |
| 1 | Ammonium fluoride | | 0.2 | ○ in 5 min | corroded in 15 min | 5 to 15 min | ○ |
| | Polyvinyl pyrrolidone | (40000) | 0.2 | | | | |
| | Ultrapure water | | 99.6 | | | | |
| 2 | Ammonium fluoride | | 0.4 | ○ in 3 min | corroded in 10 min | 3 to 10 min | ○ |
| | Polyvinyl pyrrolidone | (40000) | 0.2 | | | | |
| | Ultrapure water | | 99.4 | | | | |
| 3 | Ammonium fluoride | | 0.1 | ○ in 8 min | corroded in 19 min | 8 to 19 min | ○ |
| | Polyvinyl pyrrolidone | (40000) | 0.2 | | | | |
| | Ultrapure water | | 99.7 | | | | |
| 4 | Ammonium fluoride | | 0.3 | ○ in 7 min | corroded in 18 min | 7 to 18 min | ○ |
| | Polyvinyl pyrrolidone | (40000) | 0.4 | | | | |
| | Ultrapure water | | 99.3 | | | | |
| 5 | Ammonium fluoride | | 0.1 | ○ in 5 min | corroded in 12 min | 5 to 12 min | ○ |
| | Polyvinyl pyrrolidone | (40000) | 0.1 | | | | |
| | Ultrapure water | | 99.8 | | | | |
| 6 | Ammonium fluoride | | 0.2 | ○ in 8 min | corroded in 16 min | 8 to 16 min | ○ |
| | Polyvinyl pyrrolidone | (40000) | 0.2 | | | | |
| | Ultrapure water | | 99.6 | | | | |
| 7 | Ammonium fluoride | | 0.2 | ○ in 5 min | corroded in 10 min | 5 to 10 min | ○ |
| | Polyvinyl pyrrolidone | (40000) | 0.2 | | | | |
| | Ultrapure water | | 99.6 | | | | |
| 8 | Ammonium fluoride | | 0.2 | ○ in 4 min | corroded in 13 min | 4 to 13 min | ○ |
| | Polyethyleneimine | (10000) | 0.1 | | | | |
| | Ultrapure water | | 99.7 | | | | |

TABLE 1-continued

| Example No. | Detergent Name Numerals in ( ) represent molecular weights | | Amount added (wt %) | Performance Removal of residue | Corrosion | Permissible washing time | Foaming |
|---|---|---|---|---|---|---|---|
| 9 | Ammonium fluoride<br>Polyacrylic acid<br>Ultrapure water | (250000) | 0.2<br>0.1<br>99.7 | ○ in<br>8 min | corroded<br>in 15 min | 8 to 15 min | ○ |
| 10 | Tetramethylammonium fluoride<br>Polyvinyl pyrrolidone<br>Ultrapure water | (40000) | 0.1<br>0.8<br>99.1 | ○ in<br>3 min | corroded<br>in 5 min | 3 to 5 min | ○ |

TABLE 2

| Example No. | Detergent Name Numerals in ( ) represent molecular weights | | Amount added (wt %) | Performance Removal of residue | Corrosion | Permissible washing time | Foaming |
|---|---|---|---|---|---|---|---|
| 11 | Hydroxylamine<br>Polyvinyl pyrrolidone<br>Ultrapure water | (40000) | 0.2<br>0.2<br>99.6 | ○ in<br>3 min | corroded<br>in 5 min | 3 to 5 min | ○ |
| 12 | 1,3-Propanediamine<br>Polyvinyl pyrrolidone<br>Ultrapure water | (40000) | 0.2<br>0.2<br>99.6 | ○ in<br>4 min | corroded<br>in 6 min | 4 to 6 min. | ○ |
| 13 | Ammonium fluoride<br>Polyethylene glycol<br>Ultrapure water | (40000) | 0.2<br>0.2<br>99.6 | ○ in<br>5 min | corroded<br>in 7 min | 5 to 7 min | ○ |
| 14 | Ammonium fluoride<br>Polyvinyl pyrrolidone<br>Dimethyl sulfoxide<br>Ultrapure water | (40000) | 0.2<br>0.2<br>9.6<br>90.0 | ○ in<br>30 min | corroded<br>in 35 min | 30 to 35 min | ○ |
| 15 | Ammonium fluoride<br>Polyvinyl pyrrolidone<br>N,N-Dimethylformamide<br>Ultrapure water | (40000) | 0.2<br>0.2<br>9.6<br>90.0 | ○ in<br>25 min | corroded<br>in 30 min | 25 to 30 min | ○ |
| 16 | Ammoniumn fluoride<br>Polyvinyl pyrrolidone<br>Dipropylene glycol monomethyl ether<br>Ultrapure water | (40000) | 0.4<br>0.2<br>30.0<br>69.4 | ○ in<br>17 min | corroded<br>in 35 min | 17 to 33 min | ○ |
| 17 | Ammonium fluoride<br>Polyvinyl pyrrolidone<br>Dimethyl sulfoxide<br>Ultrapure water | (40000) | 0.4<br>0.2<br>25.0<br>74.4 | ○ in<br>20 min | corroded<br>in 30 min | 20 to 30 min | ○ |

TABLE 3

| Comparative Example No. | Detergent Name Numerals in ( ) represent molecular weights | Amount added (wt %) | Performance Removal of residue | Corrosion | Permissible washing time | Foaming |
|---|---|---|---|---|---|---|
| 1 | Ammonium fluoride<br>N,N-Dimethylformamide<br>Ultrapure water | 1.0<br>70.0<br>29.0 | ○ in<br>18 min | corroded<br>in 15 min | — | ○ |
| 2 | Ammonium fluoride<br>Amphoteric surfactant*<br>Ultrapure water | 0.06<br>0.04<br>99.9 | ○ in<br>5 min | corroded<br>in 16 min | 5 to 16 min | X |

*Zondes TG-580 manufactured by Matsumoto Yushi Seiyaku Co.

Examples 18 to 38 and Comparative Examples 3 to 11

A thin TiN film was formed on an 8-inch silicon wafer and, then, an Al—Si—Cu film was formed thereon by using a sputtering device. A thin TiN film was further deposited thereon. Thereafter, a commercially available i-ray positive-type resist was applied thereon maintaining a thickness of about 1 micron and was pre-baked. Then, an i-ray was irradiated, followed by baking, developing, rinsing and post-baking. The resist as a mask was etched by RIE. The used resist was ashed by using a plasma reactor to use it as a sample A.

An Al—Si—Cu film was formed on an 8-inch silicon wafer by using a sputtering device and, then, a thin TiN film was formed thereon. An SOG and an oxide film were deposited thereon. Thereafter, the commercially available i-ray positive-type resist was applied thereon maintaining a thickness of about 1 micron and was pre-baked.

Then, an i-ray was irradiated, followed by baking and developing to form a hole-like resist pattern. Then, there followed the rinsing and post-baking. The resist as a mask was etched by RIE to use it as a sample B. Further, the used resist was ashed by using the plasma reactor to use it as a sample C. The ashing was conducted under the conditions of 0.04 mmHg of an oxygen gas at a temperature of 50° C. for 300 seconds to obtain the above samples A and C.

Test pieces were cut out from the thus treated silicon wafer by using a diamond cutter. Compositions shown in Tables 4 to 9 were prepared, and the test pieces were immersed in the residue-washing solutions maintained at 23° C. Each of the residue-washing solutions was tested by using a total of 40 test pieces at an immersion time interval of one minute from the start of immersion until 40 minutes have passed.

After the immersion times have passed, the test pieces were washed with ultrapure water, and the washed surfaces were observed by using a scanning electron microscope at a magnification of 40,000 times to find a time of when the side-wall deposit film and incompletely ashed product of the photoresist were removed. The shorter the time, the higher the washing performance.

The test pieces were further observed for their metal wire corrosion by using the scanning electron microscope at a magnification of 40,000 times. The testing times for the test pieces from which even a slightest corrosion was observed were roughly regarded to be corrosion-suppressing times, and were shown in Tables 4 to 9. The longer the corrosion-suppressing time, it can be said the more excellent the corrosion-preventing property.

The solutions were poured into glass bottles with caps, vigorously stirred, and were left to stand for one hour. The solutions which contained foam were denoted by X, and the solutions from which foam has favorably disappeared were denoted by ○ in Tables 4 to 9.

TABLE 4

| Example No. | Detergent Name Numerals in ( ) represent molecular weights | | Amount added (wt %) | Sample A Removal of residue | Corrosion | Permissible washing time | Foaming |
|---|---|---|---|---|---|---|---|
| 18 | Ammonium fluoride | | 0.4 | ○ in 10 min | corroded in 21 min | 10 to 21 min | ○ |
|  | Diethylene glycol monoethyl ether | | 65 | | | | |
|  | Polyvinyl pyrrolidone | (40000) | 0.2 | | | | |
|  | Ultrapure water | | 34.4 | | | | |
| 19 | Ammonium fluoride | | 0.2 | ○ in 12 min | corroded in 26 min | 12 to 26 min | ○ |
|  | Dipropylene glycol monomethyl ether | | 50 | | | | |
|  | Dimethyl sulfoxide | | 30 | | | | |
|  | Polyvinyl pyrrolidone | (40000) | 0.2 | | | | |
|  | Ultrapure water | | 19.6 | | | | |
| 20 | Ammonium fluoride | | 0.2 | ○ in 12 min | corroded in 25 min | 12 to 25 min | ○ |
|  | Dipropylene glycol monomethyl ether | | 50 | | | | |
|  | Isopropyl alcohol | | 30 | | | | |
|  | Polyvinyl pyrrolidone | (40000) | 0.2 | | | | |
|  | Ultrapure water | | 19.6 | | | | |
| 21 | Ammonium fluoride | | 0.4 | ○ in 10 min | corroded in 20 min | 10 to 20 min | ○ |
|  | Dipropylene glycol monomethyl ether | | 65 | | | | |
|  | Polyethyleneimine | (10000) | 0.2 | | | | |
|  | Ultrapure water | | 34.4 | | | | |
| 22 | 1,3-Propanediamine | | 0.4 | ○ in 9 min | corroded in 19 min | 9 to 19 min | ○ |
|  | Dipropylene glycol monomethyl ether | | 40 | | | | |
|  | Dimethyl sulfoxide | | 20 | | | | |
|  | Polyethyleneimine | (10000) | 0.2 | | | | |
|  | Ultrapure water | | 39.4 | | | | |
| 23 | Ammonium fluoride | | 0.6 | ○ in 7 min | corroded in 17 min | 7 to 17 min | ○ |
|  | Dipropylene glycol monomethyl ether | | 45 | | | | |
|  | Polyacrylic acid | (250000) | 0.2 | | | | |
|  | Ultrapure water | | 54.2 | | | | |
| 24 | 1,3-Propanediamine | | 0.4 | ○ in 8 min | corroded in 19 min | 8 to 19 min | ○ |
|  | Dipropylene glycol monomethyl ether | | 30 | | | | |
|  | N,N-Dimethylformamide | | 20 | | | | |
|  | Polyethyleneimine | (10000) | 0.4 | | | | |
|  | Ultrapure water | | 49.2 | | | | |

TABLE 5

| Example No. | Detergent Name Numerals in ( ) represent molecular weights | | Amount added (wt %) | Sample A Removal of residue | Corrosion | Permissible washing time | Foaming |
|---|---|---|---|---|---|---|---|
| 25 | Ammonium fluoride | | 0.4 | ○ in 17 min | corroded in 31 min | 17 to 31 min | ○ |
|  | Diethylene glycol monoethyl ether | | 65 | | | | |
|  | Polyvinyl pyrrolidone | (40000) | 0.2 | | | | |
|  | Ultrapure water | | 34.4 | | | | |
| 26 | Ammonium fluoride | | 0.2 | ○ in 15 min | corroded in 34 min | 15 to 34 min | ○ |
|  | Dipropylene glycol monomethyl ether | | 50 | | | | |

TABLE 5-continued

| Example No. | Detergent Name Numerals in ( ) represent molecular weights | | Amount added (wt %) | Sample A Removal of residue | Corrosion | Permissible washing time | Foaming |
|---|---|---|---|---|---|---|---|
| | Dimethyl sulfoxide | | 30 | | | | |
| | Polyvinyl pyrrolidone | (40000) | 0.2 | | | | |
| | Ultrapure water | | 19.6 | | | | |
| 27 | Ammonium fluoride | | 0.2 | ○ in 15 min | corroded in 33 min | 15 to 33 min | ○ |
| | Dipropylene glycol monomethyl ether | | 50 | | | | |
| | Isopropyl alcohol | | 30 | | | | |
| | Polyvinyl pyrrolidone | (40000) | 0.2 | | | | |
| | Ultrapure water | | 19.6 | | | | |
| 28 | Ammonium fluoride | | 0.4 | ○ in 17 min | corroded in 31 min | 17 to 31 min | ○ |
| | Dipropylene glycol monomethyl ether | | 65 | | | | |
| | Polyethyleneimine | (10000) | 0.2 | | | | |
| | Ultrapure water | | 34.4 | | | | |
| 29 | 1,3-Propanediamine | | 0.4 | ○ in 17 min | corroded in 31 min | 18 to 31 min | ○ |
| | Dipropylene glycol monomethyl ether | | 40 | | | | |
| | Dimethyl sulfoxide | | 20 | | | | |
| | Polyethyleneimine | (10000) | 0.2 | | | | |
| | Ultrapure water | | 39.4 | | | | |
| 30 | Ammonium fluoride | | 0.6 | ○ in 19 min | corroded in 29 min | 19 to 29 min | ○ |
| | Dipropylene glycol monomethyl ether | | 45 | | | | |
| | Polyacrylic acid | (250000) | 0.2 | | | | |
| | Ultrapure water | | 54.2 | | | | |
| 31 | 1,3-Propanediamine | | 0.4 | ○ in 18 min | corroded in 32 min | 18 to 32 min | ○ |
| | Dipropylene glycol monomethyl ether | | 30 | | | | |
| | N,N-Dimethylformamide | | 20 | | | | |
| | Polyethyleneimine | (10000) | 0.4 | | | | |
| | Ultrapure water | | 49.2 | | | | |

TABLE 6

| Example No. | Detergent Name Numerals in ( ) represent molecular weights | | Amount added (wt %) | Sample A Removal of residue | Corrosion | Permissble washing time | Foaming |
|---|---|---|---|---|---|---|---|
| 32 | Ammonium fluoride | | 0.4 | ○ in 11 min | corroded in 27 min | 11 to 27 min | ○ |
| | Diethylene glycol monoethyl ether | | 65 | | | | |
| | Polyvinyl pyrrolidone | (40000) | 0.2 | | | | |
| | Ultrapure water | | 34.4 | | | | |
| 33 | Ammonium fluoride | | 0.2 | ○ in 13 min | corroded in 30 min | 13 to 30 min | ○ |
| | Dipropylene glycol monomethyl ether | | 50 | | | | |
| | Dimethyl sulfoxide | | 30 | | | | |
| | Polyvinyl pyrrolidone | (40000) | 0.2 | | | | |
| | Ultrapure water | | 19.6 | | | | |
| 34 | Ammonium fluoride | | 0.2 | ○ in 14 min | corroded in 30 min | 14 to 30 min | ○ |
| | Dipropylene glycol monomethyl ether | | 50 | | | | |
| | Isopropyl alcohol | | 30 | | | | |
| | Polyvinyl pyrrolidone | (40000) | 0.2 | | | | |
| | Ultrapure water | | 19.6 | | | | |
| 35 | Ammonium fluoride | | 0.4 | ○ in 12 min | corroded in 26 min | 12 to 26 min | ○ |
| | Dipropylene glycol monomethyl ether | | 65 | | | | |
| | Polyethyleneimine | (10000) | 0.2 | | | | |
| | Ultrapure water | | 34.4 | | | | |
| 36 | 1,3-Propanediamine | | 0.4 | ○ in 11 min | corroded in 23 min | 11 to 23 min | ○ |
| | Dipropylene glycol monomethyl ether | | 40 | | | | |
| | Dimethyl sulfoxide | | 20 | | | | |
| | Polyethyleneimine | (10000) | 0.2 | | | | |
| | Ultrapure water | | 39.4 | | | | |
| 37 | Ammonium fluoride | | 0.6 | ○ in 8 min | corroded in 20 min | 8 to 20 min | ○ |
| | Dipropylene glycol monomethyl ether | | 45 | | | | |
| | Polyacrylic acid | (250000) | 0.2 | | | | |
| | Ultrapure water | | 54.2 | | | | |
| 38 | 1,3-Propanediamine | | 0.4 | ○ in 10 min | corroded in 22 min | 10 to 22 min | ○ |
| | Dipropylene glycol monomethyl ether | | 30 | | | | |
| | N,N-Dimethylformamide | | 20 | | | | |
| | Polyethyleneimine | (10000) | 0.4 | | | | |
| | Ultrapure water | | 49.2 | | | | |

TABLE 7

| Comparative Example No. | Detergent Name Numerals in ( ) represent molecular weights | Amount added (wt %) | Sample A Removal of residue | Corrosion | Permissible washing time | Foaming |
|---|---|---|---|---|---|---|
| 3 | Ammonium fluoride<br>Dimethyl sulfoxide<br>Ultrapure water | 1.0<br>49<br>50 | ○ in 7 min | corroded in 5 min | — | ○ |
| 4 | Ammonium fluoride<br>N-methyl-2-pyrrolidone<br>Pyrocatechol<br>Ultrapure water | 1.0<br>44<br>5<br>50 | ○ in 8 min | corroded in 7 min | — | ○ |
| 5 | Ammonium fluoride<br>Ethylene glycol<br>Dimethyl sulfoxide<br>Hydrogen fluoride<br>Ultrapure water | 1.0<br>34.45<br>34.45<br>0.1<br>30 | ○ in 9 min | corroded in 7 min | — | ○ |

TABLE 8

| Comparative Example No. | Detergent Name Numerals in ( ) represent molecular weights | Amount added (wt %) | Sample A Removal of residue | Corrosion | Permissible washing time | Foaming |
|---|---|---|---|---|---|---|
| 6 | Ammonium fluoride<br>Dimethyl sulfoxide<br>Ultrapure water | 1.0<br>49<br>50 | ○ in 18 min | corroded in 10 min | — | ○ |
| 7 | Ammonium fluoride<br>N-methyl-2-pyrrolidone<br>Pyrocatechol<br>Ultrapure water | 1.0<br>44<br>5<br>50 | ○ in 18 min | corroded in 16 min | — | ○ |
| 8 | Ammonium fluoride<br>Ethylene glycol<br>Dimethyl sulfoxide<br>Hydrogen fluoride<br>Ultrapure water | 1.0<br>34.45<br>34.45<br>0.1<br>30 | ○ in 16 min | corroded in 14 min | — | ○ |

TABLE 9

| Comparative Example No. | Detergent Name Numerals in ( ) represent molecular weights | Amount added (wt %) | Sample A Removal of residue | Corrosion | Permissible washing time | Foaming |
|---|---|---|---|---|---|---|
| 9 | Ammonium fluoride<br>Dimethyl sulfoxide<br>Ultrapure water | 1.0<br>49<br>50 | ○ in 8 min | corroded in 6 min | — | ○ |
| 10 | Ammonium fluoride<br>N-methyl-2-pyrrolidone<br>Pyrocatechol<br>Ultrapure water | 1.0<br>44<br>5<br>50 | ○ in 9 min | corroded in 8 min | — | ○ |
| 11 | Ammonium fluoride<br>Ethylene glycol<br>Dimethyl sulfoxide<br>Hydrogen fluoride<br>Ultrapure water | 1.0<br>34.45<br>34.45<br>0.1<br>30 | ○ in 10 min | corroded in 9 min | — | ○ |

INDUSTRIAL APPLICABILITY

The residue-washing solution of the present invention is capable of favorably washing away the photoresist on the substrate and the residue formed by the treatments such as ashing, etching, ion injection and CMP during the production of electronic circuit patterns. In particular, the residue-washing solution of the invention is highly capable of removing a variety kinds of residues. Besides, the residue-washing solution of the invention is very lowly corrosive to the insulating films, low-dielectric interlayer insulating films and wirings on the substrate wafer, and little generates foam since it does not use surfactant as a corrosion-preventing component.

In washing the substrate wafer, therefore, a variety of residues are favorably removed, corrosion to the underlayers is suppressed and, hence, a margin is imparted to the time for use. In particular, the residue-washing solution is highly capable of removing residues which are highly inorganic. Besides, the residue-washing solution of the invention is very lowly corrosive to the insulating films, low-dielectric interlayer insulating films and wirings on the substrate wafer, and little generates foam since it does not use surfactant as a corrosion-preventing component.

What is claimed is:

1. An aqueous solution for washing away residue that forms during the production of electronic circuits, said aqueous solution containing ultrapure water or a mixed solution of ultrapure water and an organic solvent as a solvent, a water-soluble high molecular compound and a dissolving agent selected from an amine and a fluoride, said fluoride being represented by the following formula (1):

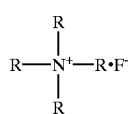

(1)

wherein four Rs may be the same or different, and are hydrogen atoms, unsubstituted alkyl groups or aryl groups;

wherein the dissolving agent is contained at a concentration of from 0.05 to 1% by weight, the water-soluble high molecular compound is contained at a concentration from 0.05 to 1% by weight and a metal ion content is not more than 50 ppb in the aqueous solution.

2. A solution for washing away residue according to claim 1, wherein the water-soluble high molecular compound is at least the one selected from the group consisting of polyvinyl pyrrolidone, polyethyleneimine and polyacrylic acid.

3. An aqueous solution for washing away residue according to claim 1, wherein the organic solvent comprises glycol ether and at least one selected from the group consisting of dimethyl sulfoxide, N,N-dimethylformamide and N-methyl-2-pyrrolidone.

4. An aqueous solution for washing away residue according to claim 1, wherein the organic solvent comprises glycol ether.

* * * * *